United States Patent
Niijima

[11] Patent Number: 5,955,907
[45] Date of Patent: Sep. 21, 1999

[54] TEMPERATURE COMPENSATION CIRCUIT AND METHOD FOR PROVIDING A CONSTANT DELAY

[75] Inventor: Hirokatsu Niijima, Gyoda, Japan

[73] Assignee: Advantest Corp., Tokyo, Japan

[21] Appl. No.: 08/909,216

[22] Filed: Aug. 11, 1997

Related U.S. Application Data

[63] Continuation-in-part of application No. 08/610,643, Mar. 4, 1996, abandoned.

[30] Foreign Application Priority Data

Mar. 3, 1995 [JP] Japan ........................................ 7-70825

[51] Int. Cl.$^6$ ............................ H03K 5/159; H03H 11/26
[52] U.S. Cl. ............................ 327/262; 327/513; 327/232
[58] Field of Search ................................... 327/261, 262, 327/269, 392, 393, 231, 232, 513

[56] References Cited

U.S. PATENT DOCUMENTS

| | | | |
|---|---|---|---|
| 4,980,586 | 12/1990 | Sullivan et al. | 327/262 |
| 5,115,155 | 5/1992 | Miida et al. | 327/262 |
| 5,428,309 | 6/1995 | Yamauchi et al. | 327/262 |
| 5,568,075 | 10/1996 | Curran et al. | 327/172 |
| 5,768,570 | 6/1998 | Kobayashi et al. | 364/490 |
| 5,886,564 | 3/1999 | Sato et al. | 327/513 |

Primary Examiner—Timothy P. Callahan
Assistant Examiner—Terry L. Englund
Attorney, Agent, or Firm—Muramatsu & Associates

[57] ABSTRACT

A temperature compensation circuit for an IC device delay circuit compensates fluctuations of delay time in the IC device caused by temperature changes. The temperature compensation circuit accurately compensates the temperature even when there exist deviations of electrical characteristics in the circuit components in the IC device delay circuit, such as heat dissipation by a heater. The temperature compensation circuit includes a heater to generate heat to raise temperature of the IC device delay circuit when the heater is on, a flip-flop for turning the heater off when an input signal is provided to an input terminal of the IC device delay circuit and turns the heater on when the input signal returns to the flip-flop after a selected delay time, a plurality of delay elements each having a predetermined delay time for producing delayed signals, and a selector circuit for selecting one of the delayed signals from the delay elements.

2 Claims, 5 Drawing Sheets

TEMPERATURE COMPENSATION CIRCUIT AND METHOD FOR PROVIDING A CONSTANT DELAY

This is a continuation-in-part of U.S. patent application Ser. No. 08/610,643, filed Mar. 4, 1996, now abandoned.

FIELD OF THE INVENTION

This invention relates to a temperature compensation circuit and method to be used for an IC device delay circuit for minimizing fluctuations of delay times caused by temperature changes or operational frequency changes in the IC device delay circuit.

BACKGROUND OF THE INVENTION

It is known that, in an IC device such as using CMOS, the amount of heat generation will change with the change of an operational frequency. Such temperature changes affect the performance of the IC device, including a signal propagation delay time. Therefore, a built-in temperature compensation circuit is sometimes used in an IC device such as an IC delay circuit to maintain the amount of heat generation constant for varying operational frequencies. Typically, such a temperature compensation circuit in the IC delay circuit includes a heater.

FIG. 4 shows an example of conventional IC delay circuit having a temperature compensation circuit. The delay circuit includes a heater 10, a set-reset (R/S) flip-flop 11, an OR circuit 12 and a delay element 20. The delay element is usually formed of a plurality of CMOS gates. The delay element 20 provides a predetermined delay time to an input signal CLK-A given at an IN terminal and generates the delayed output signal at an OUT terminal.

In this arrangement, the heater 10 is turned on when an input signal CLK-A is not provided so that the heater 10 consumes the same amount of power that would be consumed by the delay element 20 if the input signal CLK-A is with its maximum operational frequency. When the input signal CLK-A is provided to the input terminal of the delay circuit, the R/S flip-flop 11 is reset by the input signal CLK-A to make the heater 10 off. Then, after the delay time determined by the delay element 20, the delayed signal CLK-A returns to the R/S flip-flop 11 through the OR circuit 12 to set the heater 10 on again.

Therefore, in this temperature compensation circuit, the higher the frequency of the input signal CLK-A, the longer it becomes the off period of the heater 10. Thus, in this arrangement, the overall power consumption, ill combination of the heater 10 and the delay element 20, is controlled to remain constant.

FIGS. 5a-5b show the operations of the heater 10 of FIG. 4 when the input signals CLK-A with repetition cycles T and 2T, respectively, are input to the IN terminal. When the input signal CLK-A is 2T cycle (FIG. 5b), in contrast to T cycle (FIG. 5a), the number of times the heater is turned off is decreased in half. The number of times that the heater 10 is turned off varies depending on the operational cycle of the delay element 20. Thus, the total power consumption of the heater 10 and delay element 20 remains constant. As a result, the fluctuation of delay time in the delay circuit 20 due to the temperature changes is minimized by compensating the heat generated in the delay circuit as noted above.

The foregoing operations are further explained below with reference to FIGS. 4 and 5.

(1) The input signal CLK-A is provided to the delay element 20 and the R/S flip-flop 11 through the IN terminal of the delay circuit.

(2) As is well known in the art, the R/S flip-flop 11 turns the heater 10 on when a signal is supplied to the set terminal S while it turns the heater 10 off when a signal is supplied to the reset terminal R. Thus, when the signal CLK-A is input to the reset terminal R of the R/S flip-flop 11, the heater 10 is turned off.

(3) The input signal CLK-A passing through the delay element 20 is delayed by a predetermined time provided in the delay element 20. The delayed signal CLK-A is input to the set terminal S of the R/S flip-flop 11 through the OR circuit 12, which turns the heater 10 on. The delayed signal CLK-A is also output at the OUT terminal.

(4) The delay element 20 keeps the temperature constant by means of heat generated by the heater 10 when the input signal CLK-A is not provided to the delay element 20. When the signal CLK-A is applied to the delay element 20, the heater 10 is turned off during the period of the delay time of the delay element 20 by the above procedure in (1)–(3) so that the heat dissipation in the entire delay circuit is kept constant by adding the heat generated by the delay element 20 to that of the heater 10.

The above-described method of controlling the heater 10 is effective only when the amount of heat generated by the heater 10 is equal to the amount of heat generated at the maximum frequency of the input signal CLK-A, as originally designed. However, in reality, performance of each circuit element in the IC device has a certain range of variation or deviation from that intended. For example, the heat dissipation characteristics of the heater 10 greatly varies from the designed value.

Thus, the amount of overall heat generation in the delay circuit fluctuates depending on the repetition rates of the input signal CLK-A. As a result, the delay time of the delay element 20 fluctuates accordingly. Such changes in the repetition rates of the input signal CLK-A cause temperature fluctuations, resulting in an imprecise delay time for the signal CLK-A produced by the delay element 20.

SUMMARY OF THE INVENTION

It is an objective of the present invention to provide a temperature compensation circuit and method for an IC device which is capable of compensating the difference in the amount of heat generation caused by the frequency change in an input signal.

It is another object of the present invention to provide a temperature compensation circuit and method for an IC device which is capable of accurately compensating the difference in the amount of heat generation caused by the frequency changes in an input signal even when there exist variations in the heat dissipation from the intended value in the IC device.

It is a further objective of the present invention to provide a temperature compensation circuit and method for an IC device delay circuit formed of CMOS devices which is capable of compensating the difference in the amount of heat generation caused by the changes in the frequency of an input signal.

In the present invention, a temperature compensation circuit for an IC device delay circuit compensates fluctuations of delay time in the IC device delay circuit caused by temperature changes caused by frequency changes of an input signal given to the delay circuit. The temperature compensation circuit accurately compensates the temperature even when there exist deviations of electrical characteristics in the circuit component in the IC device delay circuit, such as degree of heat dissipation by a heater in the IC device delay circuit. The temperature compensation circuit includes a heater to generate heat to raise temperature of the IC device delay circuit when the heater is on, a flip-flop for turning the heater off when an input signal is provided to an input terminal of the IC device delay circuit and turns the heater on when the input signal returns to the flip-flop after a selected delay time, a plurality of delay elements each of which having a predetermined delay time for producing delayed signals, and a selector circuit for selecting the delayed signals from the delay elements.

According to the present invention, even if performance of the circuit components, such as the heat distribution characteristics of the heater 10 deviates from the expected value, the turned-off time of the heater 10 is adjusted by comparing the fluctuation of delay time with a reference delay time Xns prepared by the temperature compensation circuit. Consequently, the amount of overall heat generation in the IC device delay circuit as a whole remains constant, which achieves to suppress the temperature fluctuation in the IC device delay circuit.

Moreover, the delay time accuracy for the input signal CLK-A is considerably improved because of the precise temperature control performed by the temperature compensation circuit of the present invention.

DETAILED DESCRIPTION OF THE PREFERRED EMBODIMENT

Figure 1:
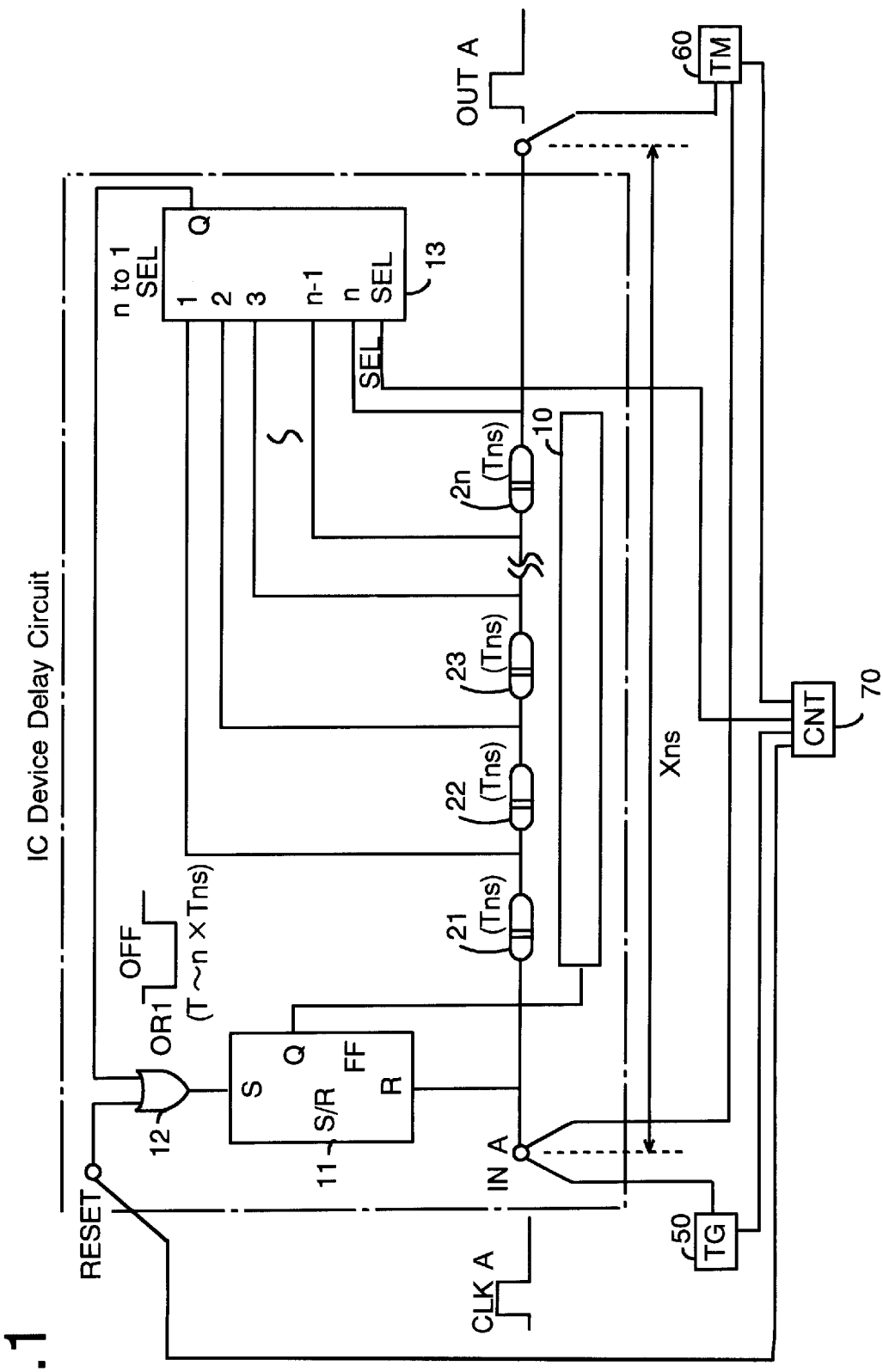
FIG. 1 is a block diagram showing a circuit configuration of the temperature compensation circuit of the present invention used in an IC device delay circuit.

FIG. 1 shows an IC device delay circuit having a temperature compensation circuit to minimize deviations in the amount of heat generation of the overall circuit which would be fluctuated by the frequency changes of an input signal CLK-A given to the IC device delay circuit. The IC device delay circuit is to provide accurate delay times to an incoming signal. A part of the temperature compensation circuit of the present invention is incorporated within the IC device delay circuit.

The IC device delay circuit includes a plurality of delay elements $2_1$–$2_n$ to produce the delay times as noted above. More precisely, the delay elements $2_1$–$2_n$ provide a predetermined delay time to an input signal CLIK-A given at an IN terminal and generates the delayed output signal at an OUT terminal. The delay elements $2_1$–$2_n$ are formed, for example, of CMOS gates.

Additionally, the IC device delay circuit includes therein a heater 10, an R/S flip-flop 11, an OR circuit 12 and a selector 13 to form the temperature compensation circuit of the present invention. As shown in FIG. 1, the temperature compensation circuit further includes a timing generator 50, a time measurement counter 60 and a control circuit 70, all of which are provided, for example, at the outside of the IC device delay circuit.

The temperature compensation circuit of the present invention utilizes the heater 10 which dissipates heat when it is turned on to increase the temperature of the IC device delay circuit. Each of the delay elements $2_1$–$2_n$ is connected to the selector 13 to provide a signal having the selected delay time to the R/S flip-flop 11. Since the delay elements $2_1$–$2_n$ are typically formed of the CMOS gates, i.e., active devices, the delay elements also dissipate heat dependent upon the frequency of signals passing therethrough.

In this circuit arrangement, the heater 10 is kept on when the input signal CLK-A is not supplied to the IC device delay circuit. The heater 10 is designed to consume the amount of power equal to the power that would have been consumed by all of the circuit components of the IC delay circuit (typically by the delay elements $2_1$–$2_n$) when the input signal CLK-A with its maximum frequency is supplied to the IC delay circuit.

Conversely, when the input signal CLK-A is supplied to the IC delay circuit, the heater 10 is turned off by the timing of the input signal CLK-A. Then, the input signal CLK-A is delayed by the series connection of the delay elements $2_1$–$2_n$ to obtain the predetermined delay time at the OUT terminal. The selector circuit 13 selects, based on a select signal SEL from the control circuit 70, an appropriate delayed signal corresponding to one of the delay elements $2_1$–$2_n$ added to the input signal CLK-A and returns the selected delayed signal to the R/S flip-flop 11 through the OR circuit 12 to turn the heater 10 on.

In this arrangement, in order to control and stabilize the difference of heat generation due to the variations of performance in the circuit components, typically the variation of the heat distribution characteristics of the heater 10, a time length of turned-off period of the heater 10 is selectively adjusted by the selector circuit 13 based on the select signal SEL from the control circuit 70.

Such an adjustment is carried out by measuring the delay time between the IN terminal and the OUT terminal of the IC device delay circuit by the time measurement counter 60. The measured delay time is compared with the reference delay time and the select signal SEL for the selector 13 is adjusted based on the comparison results.

To do this, under the control of the control circuit 70, the timing generator 50 provides a reference signal to the IN terminal. The frequency of the reference signal is preferably the maximum frequency for the IC device delay circuit so that the heater 10 is not activated. The time measurement counter 60 measures the delay time between the IN terminal and the OUT terminal and the measured result is stored in the control circuit 70 as the reference delay time Xns. The control circuit 70 sets the select signals based on the specification of the heater 10 or measuring the delay time between the IN terminal and OUT terminal when a lower frequency signal is provided at the IN terminal by the timing generator 50.

After the initial setting as noted above, the IC device delay circuit is actually used for its intended purpose. After the certain time length of use, the temperature in the IC device delay circuit is increased and balanced at the temperature for the maximum operation frequency of the IC device delay circuit. However, because of the deviations of the characteristics of the components, typically the heater 10, the delay times in the IC device delay circuit are not accurate enough. Therefore, the temperature compensation circuit of the present invention further performs to finalize the temperature calibration as follows.

Figure 2A:
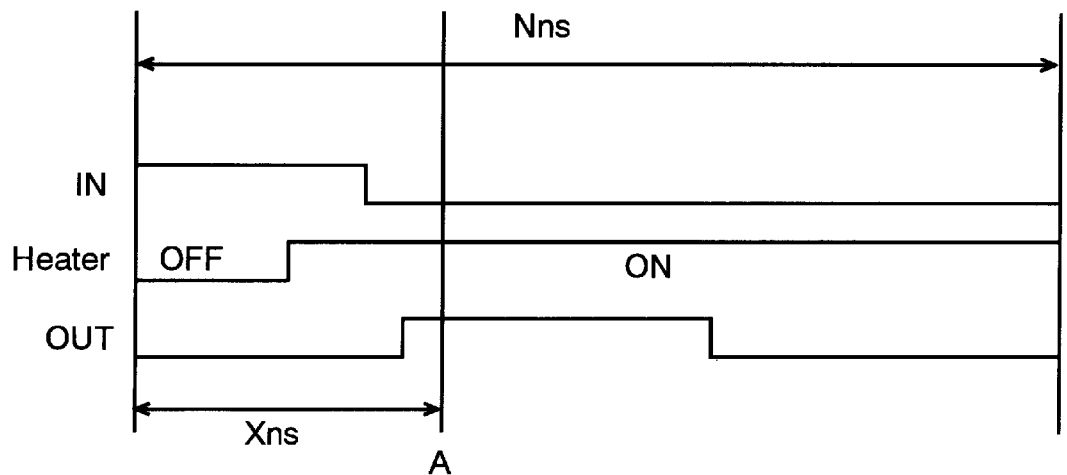
FIGS. 2a and 2b are each a timing diagram showing an operation of the temperature compensation circuit of the present invention when the amount of heat generated by the heater is smaller than that expected.
Figure 2B:
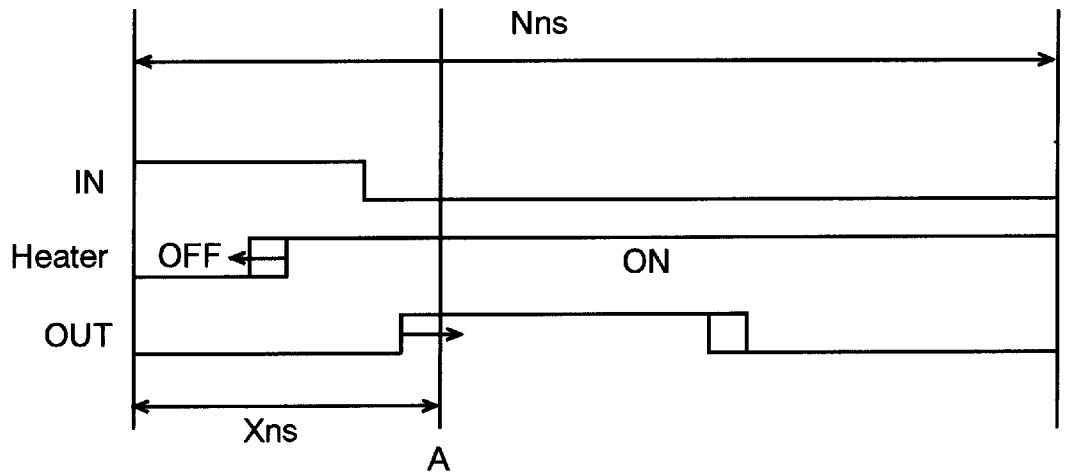

FIGS. 2a and 2b are each a timing diagram showing an operation of the temperature compensation circuit when the amount of heat generation by the heater 10 is smaller than the expected value. When the heat generation amount of the heater 10 is small and thus the temperature is lower than that expected, a delay time in the delay elements $2_1$–$2_n$ falls short. The delayed input signal is measured by the time measurement counter 60 and is compared with the reference delay time Xns by the control circuit 70. Thus, as shown in FIG. 2a, the delayed input signal CLK-A at the OUT terminal is shorter than the reference delay time Xns which is stored in the control circuit 70.

In this situation, as shown in FIG. 2b, the control circuit 70 of the temperature compensation circuit controls the selector 13 to make the turned-off period of the heater 10 shorter by selecting a delay element which is shorter in the delay time. Thus, the on period of the heater 10 is increased which raises the temperature of the IC device delay circuit and, as a result, increases the delay time in the delay elements $2_1$–$2_n$. In this manner the input signal CLK-A signal is output at the OUT terminal at the same timing as the reference delay time Xns.

Figure 3A:
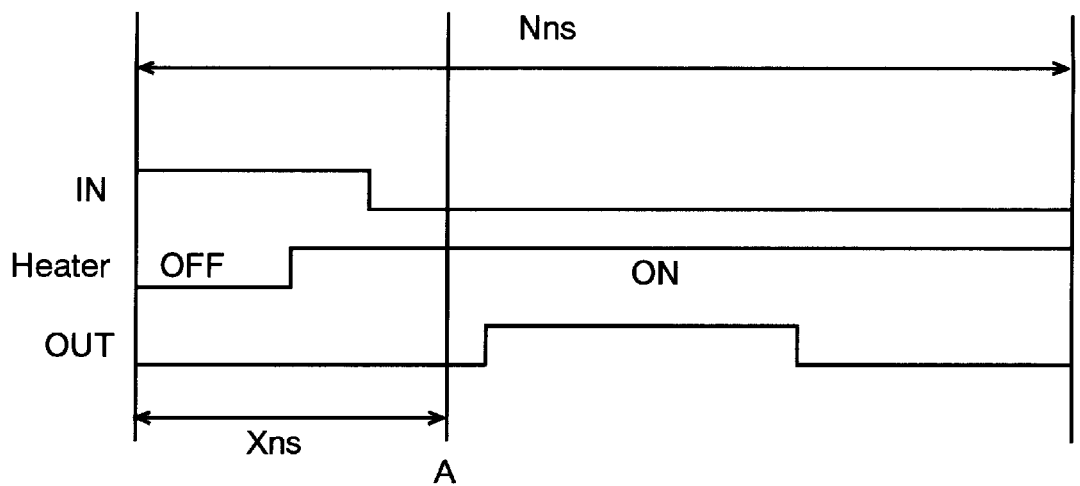
FIGS. 3a and 3b are each a timing diagram showing an operation of the temperature compensation circuit of the present invention when the amount of heat generated by the heater is larger than that expected.
Figure 3B:
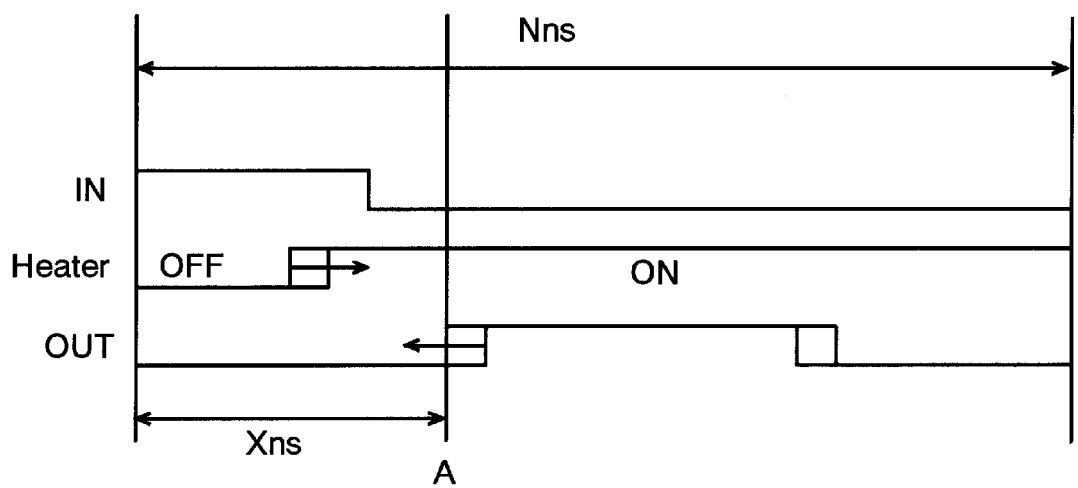
Figure 4:
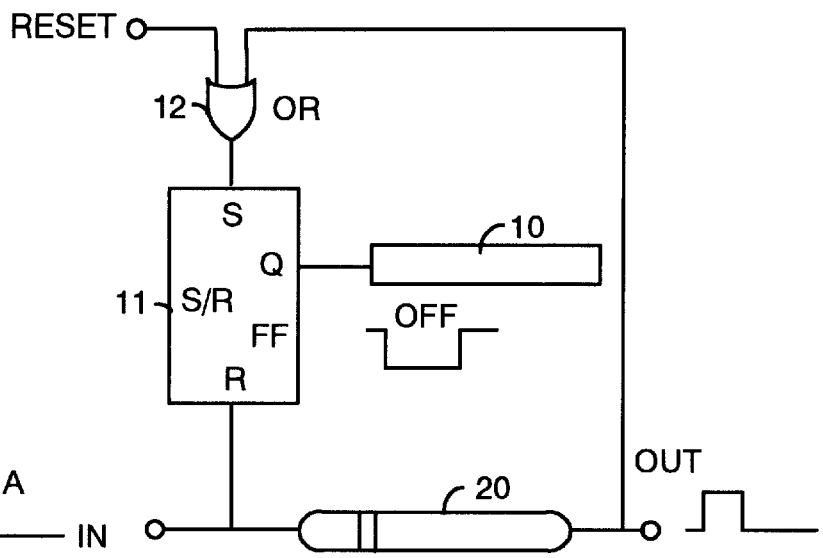
FIG. 4 is a block diagram showing a circuit configuration of the conventional temperature compensation circuit used in an IC device delay circuit.
Figure 5A:
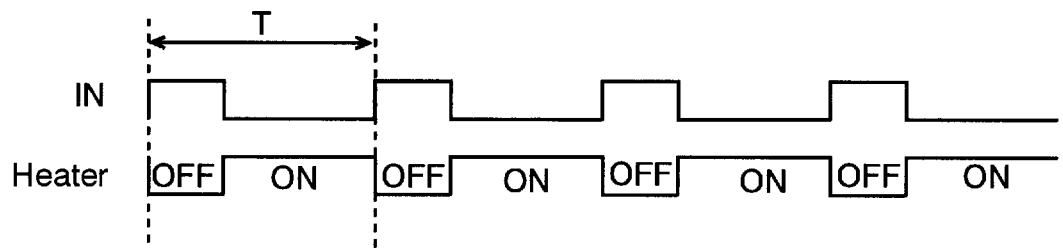
FIG. 5 is a timing diagram showing an operation of the conventional temperature compensation circuit of FIG. 5.
Figure 5B:
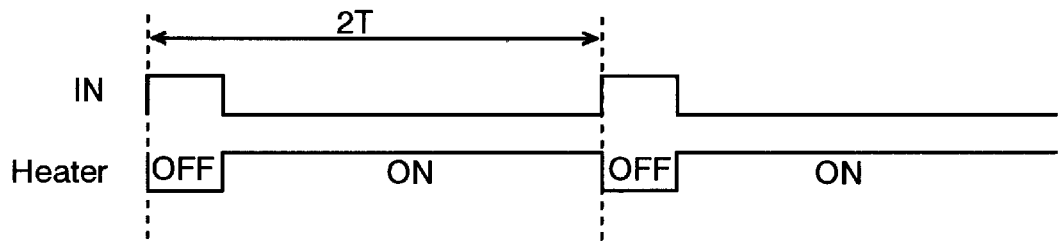

FIGS. 3a and 3b each show a timing diagram showing an operation of the temperature compensation circuit when the amount of heat generation by the heater 10 is larger than the expected value. When the heat generation amount of the heater 10 is large and thus the temperature is higher than that expected, a delay time in the delay elements $2_1$–$2_n$ falls long. Thus, as shown in FIG. 3a, the delayed input signal CLK-A is output at the OUT terminal longer than the reference delay time Xns.

In this situation, as shown in FIG. 3b, the controller 70 of the temperature compensation circuit controls the selector 13 to make the turned-off period of the heater 10 longer by selecting the increased number of delay elements to produce a longer overall delay time. Thus, the on period of the heater 10 is decreased which lowers the temperature of the IC device delay circuit and, as a result, decreases the delay time in the delay elements $2_1$–$2_n$. In this manner the input signal CLK-A is output at the OUT terminal at the same timing as the reference delay time Xns.

Figure 6:
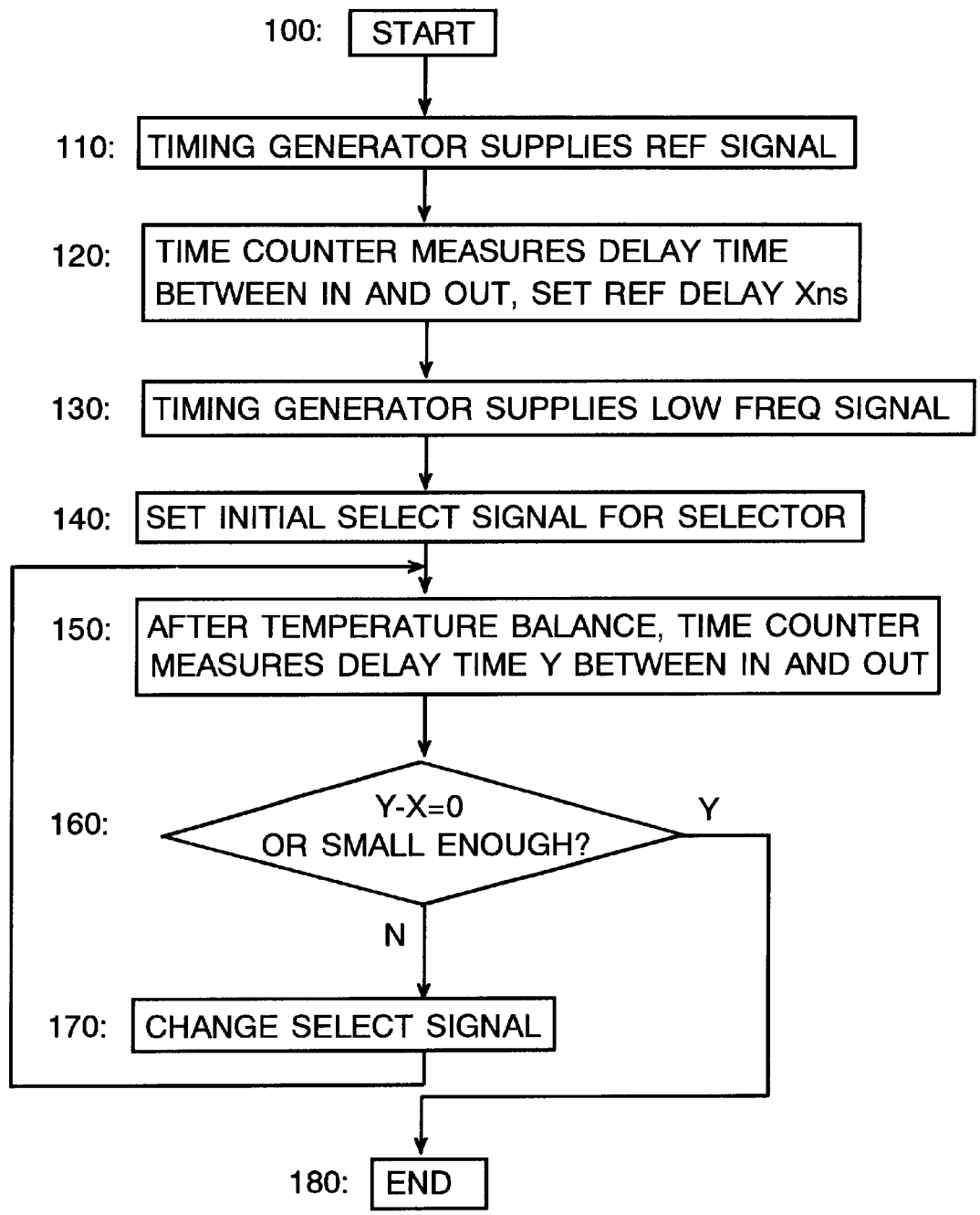
FIG. 6 is a flow chart showing the operation of the temperature compensation circuit and method of the present invention.

FIG. 6 is a flow chart showing the operation of the temperature compensation circuit and method of the present invention. The operations of the temperature compensation circuit of the present invention are summarized as follows with reference to FIGS. 1–3b and 6.

In the step 100 of FIG. 6, the temperature compensation process starts. Then the timing generator 50 provides a reference signal having the maximum operation frequency of the IC device delay circuit at the IN terminal in the step 110. The time measurement counter 60 measures the delay time of the reference signal between the IN terminal and the OUT terminal in the step 120. The measured delay time is stored in the control circuit 70 as the reference delay time Xns.

In the step 130, the timing generator provides a lower frequency signal at the IN terminal. The delay time of the lower frequency signal at the OUT terminal is measured by the time measurement counter 60. Based on the measured data and the expected characteristics of the heater 10, the control circuit 70 sets the initial values of select: signal SEL to select the delayed signals from one of the delay elements $2_1$–$2_n$ in the step 140.

After the initial setting in the foregoing, the IC device delay circuit is used for its intended purpose wherein the input signal CLK-A is supplied at the IN terminal and the delayed signal CLK-A is output at the OUT terminal through the delay elements $2_1$–$2_n$. Because of the repeated operation of the delay elements $2_1$–$2_n$ and the heater 10, the temperature of the IC device delay circuit is in the certain balanced situation. However, as noted above with reference to FIGS. 2a, 2b, 3a, and 3b, the delay time between the IN terminal and the OUT terminal may not be accurate enough because of the deviation of the characteristics of the heater 10.

Therefore, in the step 150, the time measurement counter 60 measures the delay time between the IN terminal and the OUT terminal. The measured delay time is compared with the reference delay time Xns obtained in the step 120 by the control circuit 70. If the difference between the measured delay time and the reference delay time Xns is zero or small enough, the temperature compensation process ends in the step 160. If the difference is not small enough, the control circuit 70 changes the values of the select signal SEL in such a way that the difference between the measured delay time and the reference delay time Xns becomes zero or small enough in the step 170. Because of the adjusted select signal, the selector circuit 13 changes the turned-off timing of the heater 10. The heater 10 is turned on by the input signal CLK-A which returns to the R/S flip-flop 11 after the delay time which is selected by the select signal SEL given to the selector 13.

The R/S flip-flop 11 is switched so that it turns off the heater 10 when the signal CLK-A is input to the reset terminal R. The heater 10 is then turned on when the signal is returned to the set terminal S after the delay time determined by the selected delay signal from one of the delay elements $2_1$–$2_n$ via the selector circuit 13.

During the time when the signal CLK-A is not provided to the delay elements $2_1$–$2_n$, the heater 10 keeps the temperature in the IC device delay circuit constant. When the CLK-A signal is provided to the delay circuit, the signal is transmitted to the reset terminal R of the R/S flip-flop 11 to turn the heater 10 off. Furthermore, the delayed signal CLK-A which is selected by the selector circuit 13 is input to the set terminal S of the R/S flip-flop 11 to turn the heater 10 on. During the period when the heater 10 is turned off, the selector circuit 13 is controlled so that the delay elements generate heat to keep the temperature of the delay circuit constant as a whole.

As in the foregoing, the difference in the amount of heat generation caused by the variation of heat distribution characteristics of the heater 10 is detected as a difference in the output timing between the reference delay time Xns measured and stored in the control circuit 70 and the delayed input signal at the OUT terminal.

Therefore, the delay time in the delay elements $2_1$–$2_n$, becomes shorter when the heat generated by the heater is smaller than the expected value. Conversely, the delay time in the delay elements $2_1$–$2_n$ becomes longer when the heat generated by the heater is larger than the expected value. Thus, when the heat amount generated by the heater 10 is smaller, the selector circuit 13 shortens the turned-off time of the heater 10 based on the select signal SEL from the control circuit 70 so as to increase the amount of heat generation. In a similar manner, when the heat amount generated by the heater 10 is larger, the selector circuit 13 extends the turned-off time of the heater 10 based on the select signal SEL from the control circuit 70 so as to decrease the amount of heat generation.

The present invention described in the foregoing achieves the following effects.

Even if the performance of the circuit components, such as the heat distribution characteristics of the heater 10 deviates from the expected value, the turned-off time of the heater 10 is adjusted by comparing the fluctuation of delay time due to the difference in the frequency of the input signal CLK-A with the reference delay time Xns prepared by the temperature compensation circuit. Consequently, the amount of heat generation in the entire circuit remains constant, achieving to prevent the temperature fluctuations in the IC device delay circuit.

Moreover, the delay time accuracy for the input signal CLK-A is considerably improved by the precise temperature control of the temperature compensation circuit of the present invention.

What is claimed is:

1. A temperature compensation circuit for minimizing fluctuations of delay times in an IC device delay circuit having an input terminal and an output terminal, comprising:

a heater (10) provided in said IC device delay circuit for generating heat to raise temperature of said IC device delay circuit when said heater 10 is on;

a plurality of delay elements ($2_1$–$2_n$) provided in said IC device delay circuit between said input terminal and said output terminal, each of said delay elements having a predetermined delay time and being series connected with one another;

a selector circuit (13) provided in said IC device delay circuit for selecting a delayed input signal (CLK-A) based on a select signal (SEL);

a flip-flop (11) provided in said IC device delay circuit for turning said heater (10) off when an input signal (CLK-A) is provided to said input terminal and turning said heater (10) on by said delayed input signal (CLK-A) from said selector circuit (13);

a timing generator (50) for supplying a reference signal to said input terminal to determine a reference delay time (Xns);

a time measurement counter (60) for measuring a delay time between said input terminal and said output terminal when said reference signal is provided at said input terminal or when said input signal (CLK-A) is provided at said input terminal; and a control circuit (70) for comparing said delay time measured by said time measurement counter (60) with said reference delay time (Xns) and adjusting said select signal (SEL) to said selector circuit (13) to minimize a difference between said measured delay time and said reference delay time (Xns).

2. A method of compensating temperature for minimizing fluctuations of delay times in an IC device delay circuit having a plurality of delay elements ($2_1$–$2_n$) series connected with one another between an input terminal and an output terminal, comprising the steps of:

supplying a reference signal to said input terminal and measuring a reference delay time (Xns) of said reference signal at said output terminal;

storing said reference delay time (Xns) in a control circuit (70);

providing a heater (10) in said IC device delay circuit to raise temperature of the IC device delay circuit when said heater (10) is on; said heater (10) being turned off through a flip-flop (11) when an input signal (CLK-A) is supplied to said input terminal;

transmitting said input signal (CLK-A) through said delay elements ($2_1$–$2_n$), each having a predetermined delay time;

measuring a delay time of said input signal (CLK-A) between said input terminal and said output terminal and comparing said measured delay time with said reference delay time (Xns) by said control circuit (70);

selecting a delayed input signal (CLK-A) from said delay elements ($2_1$–$2_n$) by a select signal produced by said control circuit (70) based on a comparison result between said measured delay time and said reference delay time (Xns) by said control circuit (70) in a manner to minimize the difference between said delay times; and returning said delayed input signal (SEL) (CLK-A) selected by said select signal to said flip-flop (11) to turn said heater (10) on by the timing of said delayed input signal (CLK-A).

* * * * *